United States Patent [19]

Ferry et al.

[11] Patent Number: 5,625,797

[45] Date of Patent: Apr. 29, 1997

[54] AUTOMATIC OPTIMIZATION OF A COMPILED MEMORY STRUCTURE BASED ON USER SELECTED CRITERIA

[75] Inventors: Thomas V. Ferry, San Jose; Russell L. Steinweg, Santa Clara; Michael A. Zampaglione; Pei H. Lin, both of San Jose, all of Calif.

[73] Assignee: VLSI Technology, Inc., San Jose, Calif.

[21] Appl. No.: 148,420

[22] Filed: Nov. 3, 1993

Related U.S. Application Data

[63] Continuation of Ser. No. 626,078, Dec. 10, 1990, abandoned, which is a continuation-in-part of Ser. No. 566,684, Aug. 10, 1990, abandoned.

[51] Int. Cl.⁶ ..................................... G06F 12/02
[52] U.S. Cl. ............... 395/497.04; 395/480; 364/DIG. 1
[58] Field of Search ...................... 364/200 MS File, 364/900 MS File; 365/189; 395/425, 600, 650, 700, 480, 497.01, 497.04

[56] References Cited

U.S. PATENT DOCUMENTS

| | | | |
|---|---|---|---|
| 4,035,778 | 7/1977 | Ghanem | 395/650 |
| 4,663,742 | 5/1987 | Andersen et al. | 365/189 |
| 4,811,297 | 3/1989 | Ogawa | 365/189 |
| 4,847,755 | 7/1989 | Morrison et al. | 395/650 |
| 4,885,684 | 12/1989 | Austin et al. | 395/650 |
| 5,021,947 | 6/1991 | Campbell et al. | 395/700 |
| 5,093,916 | 3/1992 | Kapp et al. | 395/700 |
| 5,247,668 | 9/1993 | Smith et al. | 395/600 |

*Primary Examiner*—Tod R. Swann
*Assistant Examiner*—James Peikari
*Attorney, Agent, or Firm*—Burns, Doane, Swecker & Mathis, LLP

[57] ABSTRACT

A block compiler system that allows a user to specify the total number of words and bits per word in a memory structure and to choose among alternative memory structures according to a user-selected criterion. In operation, the system varies the partitioning of memory address lines among column address lines and row address lines. Further, the system varies the internal memory structure according to a selected partitioning of memory address lines among column address lines and row address lines, and optimizes the memory structure based upon higher-level user-selected criteria.

7 Claims, 1 Drawing Sheet

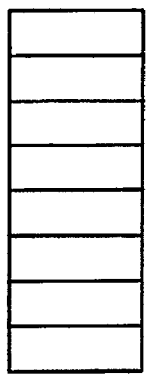
8 Rows x 1 Column
No. Row Address Lines = 3
No. Column Address Lines = 0
FIG._1A
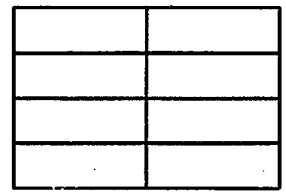
4 Rows x 2 Columns
No. Row Address Lines = 2
No. Column Address Lines = 1
FIG._1B
2 Rows x 4 Columns
No. Row Address Lines = 1
No. Column Address Lines = 2
FIG._1C
1 Row x 8 Columns
No. Row Address Lines = 0
No. Column Address Lines = 3
FIG._1D
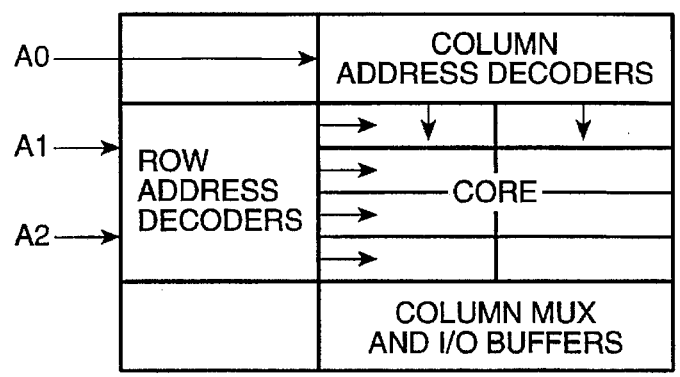
FIG._2

AUTOMATIC OPTIMIZATION OF A COMPILED MEMORY STRUCTURE BASED ON USER SELECTED CRITERIA

This application is a continuation of application Ser. No. 07/626,078, filed Dec. 10, 1990, and now abandoned, which is a continuation-in-part of U.S. application Ser. No. 7/566,684, filed Aug. 10, 1990 and now abandoned.

BACKGROUND OF THE INVENTION

1. Field of the Invention

The present invention generally relates to block compiler systems and, more particularly, to block compiler systems for generating memory structures in application-specific integrated circuits.

2. State of the Art

It is known to use computerized block compiler systems for custom designing application-specific integrated circuits (ASICs). Block compiler systems can, for instance, allow circuit design engineers to design ASICs by drawing upon libraries containing various designs of sub-cells that can be assembled to generate higher level cells. ASICs normally include one or more functional blocks, or cells which can be classified individually as LSI or VLSI circuits. For instance, a cell within an ASIC device can be a read-only memory (ROM), a random access memory (RAM), or an arithmetic logic unit.

In practice, it is important that block compiler systems allow design engineers a high degree of flexibility in choosing cell configurations. In response to this need, some block compiler systems allow users the ability to specify memory structures in terms of depth (i.e., the number of words contained in the memory) and word length (i.e., the number of bits per word). Conventional compiler systems, however, usually structure memories by rows and columns in patterns which are fixed according to the specified memory size and, therefore, do not allow users to specify the internal structure of compiled memories.

In the cell-based compiler system known as the CROM01 compiler system available from VLSI Technology, Inc., of San Jose, Calif., users are provided with limited choices as to internal structures of compiled memories. More particularly, the CROM01 compiler system allows a user to specify the internal structure of a given size ASIC memory only in terms of the memory containing either three or four column address lines.

There are several advantages to block compiler systems providing the capability of choosing internal memory structures for compiled memories and, in particular, for ASICs that are based upon gate arrays. One reason relates to the fact that bases for gate array circuits are normally available only in fixed sizes. Thus, a given gate array base may not accommodate a memory structure that is physically long and narrow even though the base has sufficient gates, in total, to implement the memory; accordingly, the long and narrow memory structure would have to be placed on a larger (and more expensive) gate array base. On the other hand, a physically more square structure of the memory might be fitted upon a smaller gate array base even if the memory occupies more gate sites. (Because of trade-offs in internal buffering and peripheral logic configurations, internal structure can affect the overall area of a memory, in terms of gate sites, even if the total words of the memory is fixed.)

Another reason that circuit design engineers would benefit from having the capability of choosing internal memory structures when using block compiler systems is that memory access times may vary according to the structure of the memories. In other words, internal memory structure, as well as internal buffering and peripheral logic, can affect the access times of memories.

SUMMARY OF THE INVENTION

Generally speaking, the present invention provides block compiler systems that allow a user to specify the total number of words and bits per word that are accommodated in a memory and to choose among alternative internal structures for that memory according to a user-selected criterion. In operation, the system selectively varies the partitioning of memory address lines between column address lines and row address lines and selectively varies the internal memory structure according to the selected partitioning of memory address lines between column address lines and row address lines, and optimizes the memory structure by selecting the best alternative structure based on a higher-level user-selected criterion.

BRIEF DESCRIPTION OF THE DRAWINGS

The present invention can be further understood by reference to the following description and the appended drawings which illustrate the invention. For purposes of description, identical components are given the same reference numerals in the various drawing figures. In the drawings:

FIGS. 1(a), 1(b), 1(c) and 1(d) show various embodiments of memory structures that accommodate eight words; and FIG. 2 shows a physical block diagram including peripheral logic for the memory structure of FIG. 1(b).

DETAILED DESCRIPTION OF THE PREFERRED EMBODIMENTS

In the following, there is described a method by which block compiler systems can be implemented for allowing system users to specify the total number of words and bits per word to be accommodated in a memory structure and, then, to choose among alternative internal structures for the selected memory according to one of several criteria. More particularly, by employing the method described below, block compiler systems can selectively vary the structure of memory between rows and columns. It should be understood that the alternative memory structures are equivalent in terms of logical function, but differ in terms of internal structure. More particularly, the alternatives can have different physical dimensions, as well as different memory access times.

As an example, FIGS. 1(a)–(d) show four ways in which eight words can be organized, by rows and columns, in a memory structure with the bits being contiguous. (Typically, the memory bits are fully static latches.) In FIG. 1(a), for example, the eight words are organized in a single column. In FIG. 1(b), as another example, the eight words are arranged in two columns, having four rows each. As still another example, FIG. 1(c) shows the eight words arranged in four columns, each having two rows. Finally, FIG. 1(d) shows the eight words arranged in a single row.

Further with regard to FIGS. 1(a) through 1(d), it should be noted that the four illustrated structures of the eight-word memory provide four different ways in which three address lines can be partitioned between row and column address lines. Depending upon the number of columns in each of the structures, some of the address lines are decoded and used to select the column containing the word being addressed. Then, for each structure, the remaining address lines are decoded and used to select the row containing the word being addressed. It should be understood that the internal structure of the memory is logically transparent to the system user. Table 1, below, summarizes the number of row and column address lines that are associated with the four alternative structures of FIG. 1.

TABLE 1

| FIG. | Row Address Lines | Column Address Lines |
|------|-------------------|----------------------|
| 1(a) | 3 | 0 |
| 1(b) | 2 | 1 |
| 1(c) | 1 | 2 |
| 1(d) | 0 | 3 |

More generally, a memory can be internally structured into multiple rows and columns of words. For instance, a memory structure that has a capacity of 1024 words can be arranged in a rectangular array having sixty-four rows and sixteen columns (since, 64×16=1024). Alternatively, the 1024 words can be arrayed into thirty-two rows and thirty-two columns. In practice, rows or columns of buffers are intermittently inserted between the rows and columns of words at essentially fixed intervals in both directions, thereby making the internal memory expandable without substantial constraint.

When a memory structure has 1024 words, for example, a total of ten address lines is required (since $\log_2 1024=10$). For the above case in which the 1024-word memory structure is arranged as an array having sixteen columns and sixty-four rows, four of those address lines would be decoded as column addresses (since $\log_2 16=4$) and the six other address lines would be decoded as row addresses (since $\log_2 64=6$). For the case in which the 1024-word memory structure is arranged as an array having thirty-two columns and rows, five of the address lines would be column addresses and five would be row addresses (since $\log_2 32=5$).

To provide a linear address space with no holes or gaps, the number of columns can be constrained to be an integer power of the number two. (These constraints are provided because the column address lines are considered to be low-order address lines, and the row address lines are considered to be high-order address lines.) In that case, the number of rows need not be similarly constrained; i.e., the internal memories can be structured such that the total number of words is not an integer power of two. For example, a 200-word RAM could be organized as twenty-five rows by eight columns, or as thirteen rows by sixteen columns. In the latter case, there would be extra words in the last row of the memory.

As another example, a 256-word memory (requiring eight total address lines) can be structured in nine ways, provided each of these versions fits onto the desired base. The nine different structures range from an array comprising one row and 256 columns, to an array comprising 256 rows by one column. In practice, one typical structure is thirty-two rows by eight columns, in which case five of the address lines would be row addresses and three would be column addresses. An alternative structure is sixteen rows by sixteen columns, with four row address lines and four column address lines.

At this juncture, it should be understood that a memory structure having an equal number of rows and columns is not necessarily the "most square." In practice, the term "most square" refers to the relative physical height and width, or aspect ratio, of a compiled memory, not the relative number of rows and columns in the internal memory structure. The actual physical height and width of a memory depends on additional factors, such as buffering and peripheral logic. For example, a sixty-four row by sixteen column internal memory structure might result in a memory which is more square than a thirty-two row by thirty-two column memory structure if the words in the memory structure are very long in terms of the number of bits per word or in terms of the physical aspect ratio of each bit.

Generally speaking, the number of alternative structures of a memory is equal to the total number of address lines plus one, since that is the number of ways in which the address lines can be partitioned between row and column address lines. The "plus one" term arises from the fact that a memory structure could have no address lines, as would be the case if the memory structure had only one row. Similarly, a memory structure that contains only one column would have no column address lines.

In the preferred embodiment, the compiler optimizes the memory structure by automatically selecting the best alternative structure based upon a higher-level user-selected criterion. That is, given the total number of words specified by a user, the compiler automatically chooses among several internal memory structures so as to optimize the overall compiled memory according to one of several user-selected criteria. The criteria may include, for instance, minimum area (i.e., total number of gate sites occupied by the memory), most square aspect ratio, and minimum access time of the overall compiled memory. In practice, different criteria may result in the same memory structure being chosen by the compiler.

At this juncture, it should be understood that the area and aspect ratio of a compiled memory structure are affected by several factors in addition to the number of rows and columns in the internal structure. For example, the area and aspect ratio of a compiled memory structure reflects the number of bits per word and the physical aspect ratio of each bit. In addition, the area and aspect ratio of a compiled memory structure are affected by buffering and peripheral logic circuitry, including address decoders. In turn, the structure of the buffering and peripheral logic circuitry depends on the rows and columns that comprise an internal memory structure. Finally, internal memory structure and the resulting peripheral circuitry also affect the memory access time.

When generating memory blocks for ASICs, the above-described block compiler system operates iteratively to consider alternative structures of the memory. In practice, a block compiler system can perform the iterations by sequentially varying the partitioning of address lines between column address lines and row address lines. More particularly, a block compiler system can be implemented to enumerate alternative structures by incrementing the number of column address lines from zero to the total number of address lines available. For each enumerated structure, the compiler evaluates the structure based upon the selected criterion (e.g., overall area, aspect ratio, or access time of the compiled memory). During such enumeration, the compiler keeps track of the best structure and result encountered so far, while omitting consideration of alternative structures that violate selected constraints such as will be described below.

For example, in terms of FIGS. 1(a) through 1(d), the block compiler system would first evaluate the structure shown in FIG. 1(a)—because that structure has zero column address lines. Then, the block compiler system would evaluate the structure shown in FIG. 1(b)—because that structure has one column address line. The other structures in FIGS. 1(c) through 1(d) would then be evaluated in order. For each of the memory structures, a block compiler system would evaluate the user-selected criterion (e.g., the overall area, aspect ratio, or access time). Then, the one of the structures with the best "score" under the selected criterion would be selected by the block compiler system.

In practice, it is desirable to include means to impose architectural constraints on the above-described block compiler system for avoiding excessive electrical loading on nodes in compiled circuits. For example, means can be included that place maximum limits on the number of rows, number of columns, and total number of bits per row in an internal memory structure. However, to minimize the need for such constraints, the block compiler systems can be implemented to insert buffers into memories at selected intervals, both horizontally and vertically.

While a memory structure is being evaluated, the buffering and peripheral logic (including the address decode circuitry) is determined by the block compiler system. In other words, for each memory structure considered, the compiler system determines the peripheral logic for the structure and then evaluates the selected criterion.

FIG. 2 shows, by way of example, peripheral logic for the memory structure of FIG. 1(b). In that drawing, the arrows denote the address lines, before and after decoding. The internal memory words are in the middle, with row decoding and other control circuitry on the left, column decoding on the top, and input-output (I/O) multiplexing on the bottom. The address lines come in on the left, and the I/O data lines come out on the bottom. Normally, the address lines and the inputs and outputs are fully buffered in order to minimize input and output capacitance and transition times, with the buffering containing multiple levels if necessary.

It should be appreciated that FIG. 2 shows only one of several alternative ways in which the compiler can structure the internal memory by varying the organization of words into rows and columns. Again, the alternative structures are implemented by varying the partitioning of address lines between column address lines and row address lines.

The foregoing has described the principles, preferred embodiments and modes of operation of the present invention. However, the present invention should not be construed as being limited to the particular embodiments discussed. Accordingly, the above-described embodiments should be regarded only as illustrative, and it should be appreciated that workers skilled in the art may make variations in those embodiments without departing from the spirit and scope of the invention as defined by the following claims.

What is claimed is:

1. A compiler system for allowing a user to specify the total number of words and bits per word in a memory structure and to choose among alternative structures for the specified memory structure according to a selected criterion, comprising:

means for selectively varying the partitioning of memory address lines in a memory structure among column address lines and row address lines;

means for selectively varying a memory structure in terms of the number of rows and columns according to the selected partitioning of memory address lines among column address lines and row address lines; and means for optimizing the memory structure during compilation thereof by automatically selecting an optimal structure based upon at least one higher-level user-selectable criterion which defines a user-specified constraint of the compiled memory structure, wherein the at least one higher-level user-selectable criterion includes at least one of a selected area, a total number of gate sites occupied by the memory structure, an aspect ratio, and a minimum access time of the overall compiled memory.

2. A system according to claim 1 wherein elements in the memory structure are random access memory elements.

3. A system according to claim 1 wherein the compiler system is a gate array block compiler.

4. A process for implementing a block compiler system such that the system allows a user to specify the total number of words in a memory structure and to choose among alternative structures for the specified memory structure according to a selected criterion, comprising:

selecting the total number of words in a memory structure of an application-specific integrated circuit;

selectively varying the partitioning of memory address lines of the memory structure, in terms of column address lines and row address lines; and optimizing the memory structure by selecting an optimal structure based on at least one higher-level user-selected criterion during compilation of the memory structure which defines a user-specified constraint of the compiled memory structure, wherein the at least one higher-level user-selectable criterion includes at least one of a selected area, a total number of gate sites occupied by the memory, an aspect ratio, and a minimum access time of the overall compiled memory structure.

5. A process according to claim 4 wherein the elements in the memory structure are random access memory elements.

6. A process according to claim 4 wherein the compiler system is a gate array block compiler system.

7. A process according to claim 4 further including a step of selecting a number of bits per word for the memory structure of an application-specific integrated circuit.

* * * * *